(12) United States Patent
Reiherzer et al.

(10) Patent No.: US 10,222,032 B2
(45) Date of Patent: Mar. 5, 2019

(54) LIGHT EMITTER COMPONENTS AND METHODS HAVING IMPROVED ELECTRICAL CONTACTS

(71) Applicant: CREE, Inc., Durham, NC (US)

(72) Inventors: Jesse Colin Reiherzer, Wake Forest, NC (US); Christopher P. Hussell, Cary, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/800,260

(22) Filed: Mar. 13, 2013

(65) Prior Publication Data

US 2013/0279169 A1 Oct. 24, 2013

Related U.S. Application Data

(60) Provisional application No. 61/618,327, filed on Mar. 30, 2012, provisional application No. 61/642,995, filed on May 4, 2012.

(51) Int. Cl.
| | |
|---|---|
| *F21V 19/00* | (2006.01) |
| *F21V 23/06* | (2006.01) |
| *H01L 33/62* | (2010.01) |
| *H01L 23/00* | (2006.01) |
| *H01L 33/48* | (2010.01) |

(52) U.S. Cl.
CPC ............ *F21V 19/001* (2013.01); *F21V 23/06* (2013.01); *H01L 24/32* (2013.01); *H01L 33/62* (2013.01); *H01L 33/486* (2013.01); *H01L 2224/48091* (2013.01); *H01L 2224/73265* (2013.01); *H01L 2924/12041* (2013.01); *H01L 2924/15787* (2013.01); *Y10T 29/49155* (2015.01); *Y10T 29/49165* (2015.01)

(58) Field of Classification Search
None
See application file for complete search history.

(56) References Cited

U.S. PATENT DOCUMENTS

| | | |
|---|---|---|
| 4,946,547 A | 8/1990 | Palmour |
| 5,200,022 A | 4/1993 | Kong |
| RE34,861 E | 2/1995 | Davis |
| (Continued) | | |

FOREIGN PATENT DOCUMENTS

| | | |
|---|---|---|
| CN | 1815766 | 8/2006 |
| CN | 1947266 A | 4/2007 |
| (Continued) | | |

OTHER PUBLICATIONS

Machine translation of JP 2000-022218 A published Jan. 21, 2000 Tadaaki.*

(Continued)

*Primary Examiner* — Britt D Hanley
(74) *Attorney, Agent, or Firm* — Jenkins, Wilson, Taylor & Hunt, P.A.

(57) ABSTRACT

Light emitter components and methods having improved electrical contacts and related methods are disclosed. In one embodiment, a light emitter component can include a submount, at least one light emitter chip on the submount, and at least one electrical contact disposed along portions of at least three external surfaces of the submount. The at least one electrical contact can be electrically connected to the at least one light emitter chip.

53 Claims, 4 Drawing Sheets

(56) References Cited

U.S. PATENT DOCUMENTS

| | | |
|---|---|---|
| 6,492,699 B1 | 12/2002 | Glenn et al. |
| 6,503,780 B1 | 1/2003 | Glenn et al. |
| 6,548,832 B1 | 4/2003 | Sakamoto et al. |
| 6,638,780 B2 | 10/2003 | Fukasawa et al. |
| 6,686,609 B1 | 2/2004 | Sung |
| 6,936,855 B1 | 8/2005 | Harrah |
| 6,953,255 B2 | 10/2005 | Horiuchi et al. |
| D511,328 S | 11/2005 | Wang |
| 7,034,778 B1 | 4/2006 | Hähl |
| 7,066,626 B2 | 6/2006 | Omata |
| 7,213,940 B1 | 5/2007 | Van De Ven |
| D572,210 S | 7/2008 | Lee |
| 7,521,728 B2 | 4/2009 | Andrews |
| D615,504 S | 5/2010 | Keller et al. |
| D615,505 S | 5/2010 | Butterworth et al. |
| 7,791,061 B2 | 9/2010 | Edmond |
| 7,812,365 B2 | 10/2010 | Murayama |
| D628,966 S | 12/2010 | Kuwaharada et al. |
| D631,020 S | 1/2011 | Chuang et al. |
| D633,631 S | 3/2011 | Shieh et al. |
| D637,565 S | 5/2011 | Wu et al. |
| D642,143 S | 7/2011 | Kuwaharada et al. |
| 7,982,709 B2 | 7/2011 | Sekiguchi et al. |
| D645,416 S | 9/2011 | Kuwaharada et al. |
| 8,058,088 B2 | 11/2011 | Cannon |
| D649,943 S | 12/2011 | Kuwaharada et al. |
| D649,944 S | 12/2011 | Kuwaharada et al. |
| D656,906 S | 4/2012 | Leung |
| D660,813 S | 5/2012 | Otaki et al. |
| 8,202,745 B2 | 6/2012 | Andrews |
| D662,902 S | 7/2012 | Shieh et al. |
| D667,802 S | 9/2012 | Otaki et al. |
| 8,267,550 B2 | 9/2012 | Wang |
| D670,010 S | 10/2012 | Lin |
| D680,504 S | 4/2013 | Noichi |
| 8,508,689 B2 | 8/2013 | Kuwaharada et al. |
| 8,536,787 B2 | 9/2013 | Motoya |
| 8,563,339 B2 | 10/2013 | Tarsa |
| 8,564,000 B2 | 10/2013 | Hussell et al. |
| D698,323 S | 1/2014 | Noichi |
| D698,741 S | 2/2014 | Kobayashi et al. |
| 8,669,573 B2 | 3/2014 | Medendorp, Jr. |
| 8,680,546 B2 | 3/2014 | Konishi et al. |
| 8,748,915 B2 | 6/2014 | Chan et al. |
| D710,810 S | 8/2014 | Noichi |
| D711,840 S | 8/2014 | Lowes et al. |
| D718,258 S | 11/2014 | Lowes et al. |
| D718,725 S | 12/2014 | Reihrezer et al. |
| 8,969,908 B2 | 3/2015 | Negley et al. |
| D738,832 S | 9/2015 | Hussell et al. |
| 9,203,004 B2 | 12/2015 | Hussell et al. |
| 9,496,466 B2 | 11/2016 | Hussell |
| 9,502,624 B2 | 11/2016 | Kuramoto et al. |
| 9,735,198 B2 | 8/2017 | Joo et al. |
| 9,780,268 B2 | 10/2017 | Hussell et al. |
| 2003/0067761 A1 | 4/2003 | Horiuchi et al. |
| 2004/0056265 A1 | 3/2004 | Arndt et al. |
| 2004/0069993 A1 | 4/2004 | Murano |
| 2004/0079957 A1 | 4/2004 | Andrews et al. |
| 2005/0093005 A1 | 5/2005 | Ruhnau |
| 2005/0184387 A1 | 8/2005 | Collins et al. |
| 2005/0219835 A1 | 10/2005 | Nagayama |
| 2005/0221519 A1 | 10/2005 | Leung et al. |
| 2006/0012299 A1 | 1/2006 | Suehiro et al. |
| 2006/0113906 A1 | 6/2006 | Ogawa |
| 2006/0145172 A1 | 7/2006 | Su et al. |
| 2006/0157722 A1 | 7/2006 | Takezawa et al. |
| 2006/0186418 A1 | 8/2006 | Edmond |
| 2006/0220046 A1 | 10/2006 | Yu et al. |
| 2006/0261364 A1 | 11/2006 | Suehiro et al. |
| 2007/0029569 A1 | 2/2007 | Andrews |
| 2007/0131954 A1 | 6/2007 | Murayama et al. |
| 2007/0161211 A1 | 7/2007 | Sunohara et al. |
| 2007/0228387 A1 | 10/2007 | Negley et al. |
| 2008/0012036 A1 | 1/2008 | Loh |
| 2008/0019130 A1 | 1/2008 | Wang |
| 2008/0036362 A1 | 2/2008 | Tanimoto et al. |
| 2008/0106185 A1* | 5/2008 | Yamakawa .......... C09K 11/595 313/503 |
| 2008/0203417 A1 | 8/2008 | Konishi et al. |
| 2008/0219003 A1 | 9/2008 | Park |
| 2008/0224608 A1 | 9/2008 | Konishi et al. |
| 2008/0233666 A1 | 9/2008 | Park |
| 2008/0258130 A1 | 10/2008 | Bergmann et al. |
| 2009/0057690 A1 | 3/2009 | Chakraborty |
| 2009/0057699 A1 | 3/2009 | Basin et al. |
| 2009/0057901 A1 | 3/2009 | Lin et al. |
| 2009/0108281 A1 | 4/2009 | Keller et al. |
| 2009/0115313 A1 | 5/2009 | Lu et al. |
| 2009/0140271 A1 | 6/2009 | Sah |
| 2009/0146176 A1 | 6/2009 | Oishi |
| 2009/0166657 A1 | 7/2009 | Yamada et al. |
| 2009/0218584 A1 | 9/2009 | Bogner |
| 2009/0315157 A1 | 12/2009 | Konishi et al. |
| 2009/0322197 A1 | 12/2009 | Helbing |
| 2010/0022040 A1 | 1/2010 | Konishi |
| 2010/0078664 A1 | 4/2010 | Helbing |
| 2010/0155763 A1 | 6/2010 | Donofrio et al. |
| 2010/0187546 A1 | 7/2010 | Fushimi et al. |
| 2010/0193822 A1 | 8/2010 | Inobe et al. |
| 2010/0212942 A1 | 8/2010 | Tuan et al. |
| 2010/0237375 A1 | 9/2010 | Yamazaki et al. |
| 2010/0252851 A1 | 10/2010 | Emerson et al. |
| 2010/0258830 A1 | 10/2010 | Ide et al. |
| 2010/0259706 A1 | 10/2010 | Kuwaharada |
| 2010/0289055 A1 | 11/2010 | Tan et al. |
| 2010/0301367 A1 | 12/2010 | Nakamura et al. |
| 2011/0001156 A1 | 1/2011 | Matsuda |
| 2011/0006334 A1 | 1/2011 | Ishii |
| 2011/0018017 A1 | 1/2011 | Bierhuizen et al. |
| 2011/0031524 A1 | 2/2011 | Pei |
| 2011/0062471 A1 | 3/2011 | Bierhuizen et al. |
| 2011/0079801 A1 | 4/2011 | Zhang et al. |
| 2011/0089465 A1 | 4/2011 | Lin et al. |
| 2011/0127903 A1 | 6/2011 | Yao |
| 2011/0220929 A1 | 9/2011 | Collins et al. |
| 2011/0273079 A1 | 11/2011 | Pickard et al. |
| 2011/0309396 A1 | 12/2011 | Wang et al. |
| 2011/0316024 A1 | 12/2011 | Hung |
| 2012/0153340 A1 | 6/2012 | Song |
| 2012/0299022 A1 | 11/2012 | Hussell |
| 2012/0305949 A1 | 12/2012 | Donofrio et al. |
| 2012/0319150 A1 | 12/2012 | Shimomura |
| 2013/0087822 A1 | 4/2013 | Kim |
| 2013/0099265 A1 | 4/2013 | Hwang |
| 2013/0193468 A1 | 8/2013 | Hussell et al. |
| 2013/0256711 A1 | 10/2013 | Joo |
| 2013/0270592 A1 | 10/2013 | Reiherzer et al. |
| 2014/0097453 A1 | 4/2014 | Hussell et al. |
| 2014/0291715 A1 | 10/2014 | Reiherzer et al. |
| 2015/0280082 A1 | 10/2015 | Amo |

FOREIGN PATENT DOCUMENTS

| | | |
|---|---|---|
| CN | 101026206 A | 8/2007 |
| CN | 101056960 A | 10/2007 |
| CN | 101614339 A | 12/2009 |
| CN | 101971378 A | 2/2011 |
| CN | 102280567 | 12/2011 |
| CN | ZL 201330359083.X | 5/2014 |
| CN | 103270614 B | 5/2017 |
| CN | 104969368 B | 8/2017 |
| CN | 104205380 B | 9/2018 |
| EP | 1640792 | 3/2006 |
| EP | 2 560 219 A1 | 2/2013 |
| JP | 2000-022218 | 1/2000 |
| JP | 2000-353826 A | 12/2000 |
| JP | 2001-160630 | 6/2001 |
| JP | 2001-237462 | 8/2001 |
| JP | 2006/066786 A | 3/2006 |
| JP | 2006-093435 | 4/2006 |
| JP | 2006-294898 | 10/2006 |
| JP | 2007-189006 | 7/2007 |
| JP | 2009-044055 | 2/2009 |

(56) References Cited

FOREIGN PATENT DOCUMENTS

| JP | 2009-146935 | 7/2009 |
|---|---|---|
| JP | 2010-009972 A | 1/2010 |
| KR | 10-0829910 | 1/2000 |
| KR | 10-0829910 | 5/2008 |
| KR | 10-0933920 | 12/2009 |
| KR | 10-2010-0008509 | 1/2010 |
| KR | 10-2011-0111941 | 10/2011 |
| TW | 540169 | 7/2003 |
| TW | D140389 | 5/2011 |
| TW | D162119 | 8/2014 |
| WO | WO 2008/041813 A1 | 4/2008 |
| WO | WO 2008/069204 A1 | 6/2008 |
| WO | WO 2011/129203 | 10/2011 |
| WO | WO 2013/148823 | 10/2013 |
| WO | WO 2013/148826 | 10/2013 |
| WO | WO 2014/120256 | 8/2014 |

OTHER PUBLICATIONS

Machine translation of KR 10-2009-0049979 published Dec. 28, 2009 kim et al.*
Non-Final Office Action for U.S. Appl. No. 13/755,993 dated Nov. 5, 2014.
Non-Final Office Action for U.S. Appl. No. 13/834,195 dated Nov. 19, 2014.
Final Office Action for U.S. Appl. No. 13/800,284 dated Dec. 16, 2014.
Non-Final Office Action for U.S. Appl. No. 13/800,284 dated Jun. 30, 2014.
Restriction Requirement for U.S. Appl. No. 13/755,993 dated Jul. 10, 2014.
Restriction Requirement for U.S. Appl. No. 13/834,195 dated Jul. 21, 2014.
International Search Report and Written Opinion for Application No. PCT/US2013/035411 dated Oct. 15, 2013.
Chinese Correction of Deficiencies for Application No. 201330359083.X dated Nov. 5, 2013.
Taiwanese Office Action and Search Report for Application No. 102302923 dated Dec. 30, 2013.
Chinese Notice of Grant for Application No. 201330359083.X dated Jan. 26, 2014.
Taiwanese Notice of Allowance for Application No. 102302923 dated Apr. 7, 2014.
Restriction Requirement for U.S. Appl. No. 13/800,284 dated Mar. 31, 2014.
Restriction Requirement for U.S. Appl. No. 29/444,591 dated Jan. 30, 2015.
Final Office Action for U.S. Appl. No. 13/834,195 dated Mar. 6, 2015.
Final Office Action for U.S. Appl. No. 13/755,993 dated Mar. 6, 2015.
Advisory Action for U.S. Appl. No. 13/800,284 dated Mar. 13, 2015.
Interview Summary for U.S. Appl. No. 13/800,284 dated Mar. 19, 2015.
Notice of Allowance for U.S. Appl. No. 29/444,591 dated May 12, 2015.
Advisory Action for U.S. Appl. No. 13/800,284 dated Jan. 4, 2016.
Non-Final Office Action for U.S. Appl. No. 13/834,195 dated Feb. 26, 2016.
Non-Final Office Action for U.S. Appl. No. 13/800,284 dated Jun. 4, 2015.
Non-Final Office Action for U.S. Appl. No. 13/755,993 dated Nov. 27, 2015.
Chinese Office Action for Application No. 2013800181871 dated Oct. 17, 2016.
Non-Final Office Action for U.S. Appl. No. 13/755,993 dated Sep. 22, 2016.
Non-Final Office Action for U.S. Appl. No. 13/800,284 dated May 19, 2016.
Final Office Action for U.S. Appl. No. 13/755,993 dated Apr. 8, 2016.
Advisory Action for U.S. Appl. No. 13/755,993 dated Jun. 16, 2016.
Final Office Action for U.S. Appl. No. 13/834,195 dated Jun. 23, 2016.
Chinese Office Action for Application No. 2013800181871 dated Apr. 25, 2016.
Chinese Office Action for Application No. 201380018673 dated Jun. 21, 2016.
Interview Summary for U.S. Appl. No. 13/755,993 dated Apr. 25, 2017.
Non-Final Office Action for U.S. Appl. No. 13/800,284 dated May 1, 2017.
Chinese Office Action for Application No. 2013800181871 dated Apr. 20, 2017.
Notice of Allowance and After Final Consideration Program Decision for U.S. Appl. No. 13/755,993 dated Jun. 1, 2017.
Notice of Issuance for Chinese Application No. 201380071952.6 dated Jun. 2, 2017.
Corrected Notice of Allowance for U.S. Appl. No. 13/755,993 dated Jun. 20, 2017.
Chinese Office Action for Application No. 201180065495 dated Nov. 4, 2016.
Final Office Action for U.S. Appl. No. 13/800,284 dated Nov. 22, 2016.
Non-Final Office Action for U.S. Appl. No. 13/834,195 dated Nov. 28, 2016.
Chinese Office Action for Chinese Application No. 201380071952 dated Nov. 2, 2016.
Chinese Notice of Grant for Chinese Application No. 201180061776 dated Feb. 15, 2017.
U.S. Appl. No. 13/028,972 for "Light Emitting Devices and Methods" filed Feb. 16, 2011.
International Search Report and Written Opinion for Application Serial No. PCT/US2011/058596 dated Jun. 18, 2012.
Office Action/Restriction Requirement for U.S. Appl. No. 13/028,972 dated Jul. 25, 2012.
Non-Final Office Action for U.S. Appl. No. 13/028,972 dated Oct. 10, 2012.
Notice of Allowance for U.S. Appl. No. 13/028,972 dated Feb. 28, 2013.
Notice of Allowance for U.S. Appl. No. 13/028,972 dated May 23, 2013.
Restriction Requirement for U.S. Appl. No. 14/043,494 dated Mar. 20, 2014.
Notice of Publication for U.S. Appl. No. 14/043,494 dated Apr. 10, 2014.
Non-Final Office Action for U.S. Appl. No. 14/043,494 dated Jun. 20, 2014.
European Patent Office Communication pursuant to Rule 114(2) EPC for Application No. 20110843026 dated Sep. 24, 2014.
Taiwanese Office Action for Application No. 100141887 dated Sep. 11, 2014.
Notice of Allowance for U.S. Appl. No. 14/043,494 dated Dec. 10, 2014.
Notice of Allowance for U.S. Appl. No. 14/043,494 dated Apr. 17, 2015.
European Search Report for Application No. 11 84 3026 dated Apr. 28, 2015.
Supplemental Notice of Allowability for U.S. Appl. No. 14/043,494 dated May 28, 2015.
Taiwanese Notice of Allowance for Application No. 100141887 dated May 28, 2015.
Chinese Office Action for Application No. 201180061776.9 dated Jun. 10, 2015.
Notice of Allowance for U.S. Appl. No. 14/043,494 dated Jul. 30, 2015.
Chinese Office Action for Application No. 201180061776.9 dated Feb. 22, 2016.
Final Office Action for U.S. Appl. No. 13/755,993 dated Mar. 13, 2017.

(56) References Cited

OTHER PUBLICATIONS

Notice of Allowance for U.S. Appl. No. 13/834,195 dated Apr. 11, 2017.
Notice of Allowance for U.S. Appl. No. 13/834,195 dated Jun. 22, 2017.
Interview Summary for U.S. Appl. No. 13/800,284 dated Jul. 19, 2017.
Chinese Decision of Rejection for Application No. 2013800181871 dated Aug. 9, 2017.
Final Office Action for U.S. Appl. No. 13/800,284 dated Sep. 28, 2017.
International Search Report and Written Opinion for Application No. PCT/US2013/034084 dated Jul. 25, 2013.
International Search Report and Written Opinion for Application No. PCT/US2013/034087 dated Jul. 25, 2013.
U.S. Appl. No. 13/607,217 dated Sep. 7, 2012.
Fourth Office Action for Chinese Application No. 2013800181871 dated Jan. 19, 2018.
Restriction Requirement for U.S. Appl. No. 15/676,961, dated May 7, 2018.
Notice of Allowance for U.S. Appl. No. 13/800,284 dated Jul. 23, 2018.
Non-Final Office Action for U.S. Appl. No. 15/676,961 dated Aug. 30, 2018.

\* cited by examiner

LIGHT EMITTER COMPONENTS AND METHODS HAVING IMPROVED ELECTRICAL CONTACTS

CROSS REFERENCE TO RELATED APPLICATIONS

This application relates and claims priority to U.S. Provisional Patent Application Ser. Nos. 61/618,327, filed Mar. 30, 2012, and 61/642,995, filed May 4, 2012. This application also relates to U.S. patent application for SUBMOUNT BASED SURFACE MOUNT DEVICE (SMD) LIGHT EMITTER COMPONENTS AND METHODS, filed Mar. 13, 2013. The entire contents of each of these references are hereby incorporated by reference herein.

TECHNICAL FIELD

The subject matter disclosed herein relates generally to light emitter components and methods. More particularly, the subject matter disclosed herein relates to light emitting diode (LED) components and methods having improved electrical contacts configured to extend over portions of external sides of a component submount.

BACKGROUND

Light emitting diodes (LEDs) or LED chips are solid state devices that convert electrical energy into light. LED chips can be utilized in light emitter components for providing different colors and patterns of light useful in various lighting and optoelectronic applications. For example, light emitter components can be used in various LED light bulb and light fixture applications and are developing as replacements for incandescent, fluorescent, and metal halide high-intensity discharge (HID) lighting applications.

Conventional light emitter components utilize one or more LED chips mounted over a plastic, metal, or ceramic substrate or submount. In conventional designs, LED chips can receive electrical signal or current from electrical contacts in the form of lead frames (e.g., "leads") which are at least partially embedded within the submount via molding at least a portion of the leads within the body of the submount. In other aspects, electrical contacts disposed on an upper surface of the submount electrically communicate with electrical contacts on a bottom surface of the submount by passing electrical current through one or more internal, electrically conductive thru-holes or vias. Embedding electrical contacts and/or connecting electrically contacts internally within the submount can lead to increased processing time as well as cost of the components.

Thus, despite the availability of various light emitter components in the marketplace, a need remains for emitter components and methods having improved electrical contacts which can be produced quickly and efficiently. In one aspect, improved electrical contacts configured to wrap-around and/or extend over and cover portions of external sides or surfaces of a component submount are desired.

SUMMARY

In accordance with this disclosure, light emitter components and methods having improved electrical contacts are provided and described herein. Components and methods described herein can advantageously exhibit improved processing times, ease of manufacture, and/or lower processing costs. In addition, improved contacts can be configured to cover one or more external surfaces or lateral sides, which can advantageously electrically and/or thermally connect with more than one component along more than one side, where desired. Components described herein can be well suited for a variety of applications such as personal, industrial, and commercial lighting applications including, for example, light bulbs and light fixture products and/or applications. It is, therefore, an object of the present disclosure to provide light emitter components and methods having improved electrical contacts, in one aspect, by utilizing electrical contacts that are completely external from the submount, such that minimal processing is required to be performed to the submount.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
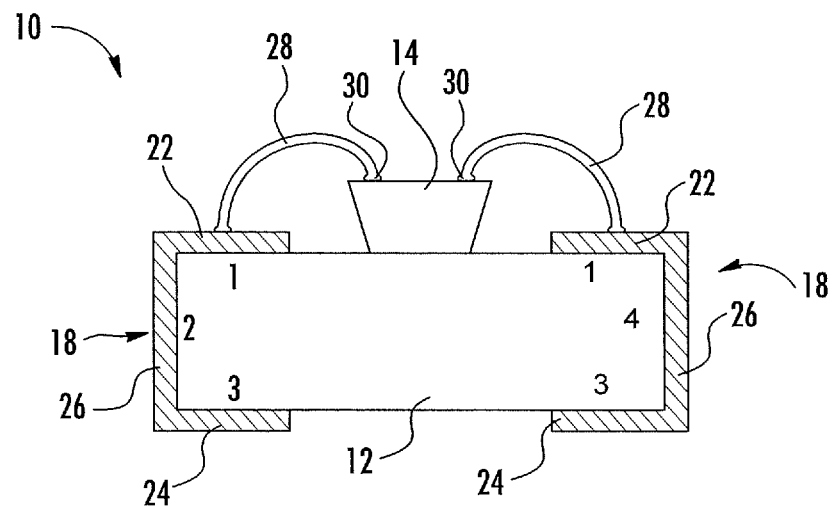
FIGS. 1 and 2 are cross-sectional views of a light emitter component according to the disclosure herein.

The subject matter disclosed herein is directed to light emitter components such as light emitting diode (LED) components and methods having improved performance, ease of manufacture, cost, and improved electrical contacts. In one aspect, a novel surface mount device (SMD) component is provided. The component can advantageously comprise a novel electrical contact utilizing a back or side electrical contact portion tied to the external "leads", or top and bottom contact portions. Notably, the back or side contact portion can be disposed exterior the submount, for example, along a portion of an exterior lateral side. The side contact portion can be electroplated or created by way of exposing a thru-hole or via (e.g., sawing or cutting through the thru-hole or via). Components described herein can comprise non-metallic submount material(s) that is/are substantially transparent and substantially non-absorbing of light emitted by one or more LED chips. Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "through-hole", "thru-hole", and/or "via" are synonymous and refer a small opening in the submount, often filled with an electrically conductive material that allows a conductive connection between different layers or features of the component. The term "exposing" a thru-hole or via refers to sawing, cutting, dicing, etching, uncovering, displacing, or otherwise causing the metal disposed inside the via to be disposed on an external surface of the submount. Thus, the conductive material will be "exposed" outside of and/or along an exterior, outer surface of the component, or component submount.

As used herein, the terms "electrical contacts", "leads", and/or "leadframes" are synonymous and refer to conductive members or elements which can pass electrical current into an LED chip, for example, by wirebonding, through die attachment, or other methods known in the art.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit a different wavelength of light such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the yellow wavelength spectrum. The components can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter components and methods according to the present subject matter can also have multiple LED chips of different colors, one or more of which can be white emitting. In some aspects, the phosphor can be mixed with silicone and dispensed over the LED chip and/or portions of the light emitter component.

Figure 2:
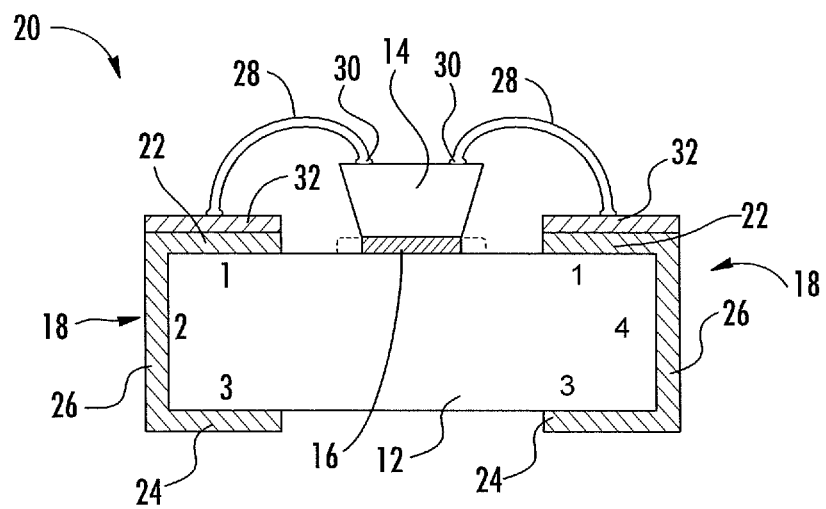

FIGS. 1 through 7B illustrate embodiments of light emitter components and methods according to the present subject matter as disclosed and described herein. FIGS. 1 and 2 are cross-sectional views of light emitter components, generally designated 10 and 20, respectively. Light emitter components 10 and 20 can comprise substrate or submount based packages for surface mount device (SMD) applications. Light emitter components 10 and 20 can comprise a non-metallic based submount 12, comprised of a non-metallic material. In one aspect, submount 12 can comprise a ceramic based material, such as a high reflectivity ceramic material for maximizing light extraction and reflectance. At least one light emitter chip, such as an LED chip 14, can be provided and disposed over submount 12. The at least one LED chip 14 can be configured to activate a yellow, red, and/or green phosphor (not shown) disposed either directly over LED chip 14 and/or directly over a portion of emitter component 10 for producing cool and/or warm white output.

In some aspects, LED chip 14 can directly attach and/or mount to submount 12 via an index matched adhesive or epoxy material (not shown). In other aspects, an optional layer of material (e.g., 16, FIG. 2) can be disposed between submount 12 and LED chip 14. Notably, as discussed further below, light emitter components 10 and 20 can comprise at least one electrical contact, generally designated 18, disposed along one or more portions of one or more external surfaces of submount 12 and spaced apart from LED chip 14. For example and in one aspect, electrical contact 18 can extend over and cover portions of at least three external surfaces of the submount (or four external surfaces where there are two opposing contacts, e.g. portions of the top surface, the bottom surface, and two opposing side surfaces). The at least one electrical contact 18 can electrically connect to the at least one LED chip 14 for providing electrical current to LED chip 14.

In one aspect, submount 12 can comprise a portion of material that has been singulated from a large, non-metallic panel (not shown); however, individually formed and/or pressed submounts are also contemplated herein. Generally, it is desirable to provide a substrate or submount 12 that is highly reflective to visible light (e.g., greater than about 90%), and which can provide conduction of heat as well as mechanical support. In one aspect, non-metallic and/or ceramic materials containing aluminum oxide (e.g., alumina or $Al_2O_3$) exhibit such desirable qualities. Accordingly, submount 12 can comprise a ceramic based body of material such as $Al_2O_3$ and/or containing $Al_2O_3$.

In one aspect, submount 12 can comprise a ceramic body that can be cast from low temperature co-fired ceramic (LTCC) materials or high temperature co-fired ceramic (HTCC) materials and related processes. In one embodiment, submount 12 can be individually cast from a thin green ceramic tape and subsequently fired. Submount 12 can also be cast and subsequently fired and singulated from a panel of submounts formed from a thin green ceramic tape. Where used, the ceramic tape can comprise any ceramic filler material known in the art, for example, submount 12 can comprise a glass ceramic, such as $Al_2O_3$ or aluminum nitride (AlN) having 0.3 to 0.5 weight percent of glass frits. The glass frits can be used as a binder and/or sintering inhibitor within the ceramic tape when the tape is fired.

A green ceramic tape used for submount 12 can advantageously comprise any thickness desired, thus contributing to a thinner size when desired. Submount 12 can further comprise a ceramic material having any of a variety of scattering particles contained therein. Examples of suitable scattering particles can for example comprise particles of $Al_2O_3$, $TiO_2$, $BaSO_4$, and/or AlN. Submount 12 can be produced by thin- or thick-film processing techniques available at and including products available from CoorsTek, headquartered in Golden, Colo. Such substrates or submounts 12 can optionally be fired along with other materials (e.g., zirconia, $ZrO_2$) to further improve optical and mechanical properties.

Submount 12 can comprise any suitable size, shape, orientation, and/or configuration. For illustration purposes, a substantially square shaped submount 12 is shown, however, any shape of submount is contemplated herein, for example, any one of a substantially rectangular, circular, oval, rounded, regular, irregular, or asymmetrically shaped submount is also contemplated herein. Submount 12 can comprise a substantially square or rectangular shape that can for example have at least one side of approximately 25 millimeters (mm) or less, such as approximately 20 mm or less; approximately 15 mm less; approximately 10 mm or less; approximately 6 mm or less; approximately 3 mm or less; and/or a submount having at least one side of approximately 1 mm or less. Submount 12 can comprise a thickness of approximately 2 mm or less, such as approximately 1 mm or less; approximately 0.5 mm or less; or approximately 0.25 mm or less. In one aspect, submount 12 comprises a thickness of approximately 0.63 mm.

As FIG. 2 illustrates, at least one optional coating and/or layer of material 16 can be disposed over submount 12. In one aspect, layer 16 can be applied to submount 12 prior to die attaching or bonding LED chip 14 to submount 12. Layer 16 can comprise any suitable material for increasing the bonding and/or amount of heat conducted between LED chip 14 and submount 12. For example, layer 16 can comprise a silicone, epoxy, or any other polymer known to those having skill in the art. Alternatively, layer 16 can comprise a ceramic or metal material. In addition, layer 16 can contain reflective particles therein, such as $Al_2O_3$, $TiO_2$, $ZrO_2$, or any other reflective particle known to those having skill in the art. Layer 16 can be fired with a flux or without a flux (i.e., in a sintering process). Furthermore, once applied, layer 16 can be mechanically modified, such as by lapping, polishing, grinding, or other mechanical modification. More than one layer 16 of material is also contemplated herein. The one or more intervening layer(s) can comprise a width that can for example be approximately equal to, less than, or greater than the width of at least one LED chip 14. As an example, layer 16 is shown with a width that is substantially the same as or approximately equal to the width of LED chip 14, however, the broken lines indicate where layer 16 could extend to.

As FIGS. 1 and 2 further illustrate, LED chip 14 can comprise substantially straight and/or beveled (e.g., sloped or inclined) lateral sides and can comprise any shape, size, dimension, structure, build, and/or color. More than one LED chip 14 can also be used. Where used, multiple chips can comprise the same shape, size, dimension, structure, build and/or color or different shapes, sizes, dimensions, structures, builds, colors, and/or combinations thereof. LED chips 14 can comprise a growth substrate or a carrier substrate (e.g., where the growth substrate is removed), and can comprise a vertically structured chip (e.g., anode and cathode on opposing surfaces of LED chip 14) or a horizontally structured chip (e.g., anode and cathode on a same surface). For illustration purposes, a horizontally structured LED chip 14 is illustrated, where both the anode and the cathode can be disposed on the upper surface in the form of two bond pads. However, both contacts (e.g., the anode and cathode) could be disposed on a bottom surface of the LED chip 14 and/or on opposing top and bottom surfaces as well.

LED chip 14 can comprise any size and/or shape. LED chip 14 can for example be substantially square, rectangular, regular, irregular, or asymmetrical in shape. In one aspect, LED chip 14 can comprise a footprint where at least one side measures approximately 2000 μm or less, such as approximately 1150 μm or less; approximately 900 μm or less; approximately 700 μm or less; approximately 600 μm or less; approximately 500 μm or less; approximately 400 μm or less; approximately 300 μm or less; approximately 200 μm or less; approximately 100 μm or less; and/or combinations thereof where multiple LED chips 14 are used. In some aspects, LED chip 14 can comprise a length and a width of approximately 580 μm×1150 μm or approximately 355 μm×710 μm.

Referring to FIGS. 1 and 2, notably, light emitter components 10 and 20 can further comprise at least one electrical contact 18 that is completely external. That is, electrical contact 18 can be disposed over, along, and/or cover portions of one or more external surfaces of submount 12, such as surfaces denoted 1-3, where at least one surface an include an external lateral surface (e.g., surface 2). In one aspect, this can advantageously improve time and cost associated with processing components descried herein by foregoing the need to mold electrical contacts within submount 12 and/or pass electrical current internally from a top contact to a bottom contact by creation of multiple thru-holes or vias. Notably, electrical contact 18 can comprise an electrically conductive top contact portion 22 and an electrically conductive bottom contact portion 24. An electrically conductive intermediate back or side contact portion 26 can be disposed therebetween, for passing electrical current directly between the top contact portion 22 and the bottom contact portion 24. In one aspect, side contact portion 26 can physically, electrically, and/or thermally connect top contact portion 22 and bottom contact portion 24.

In one aspect, electrical contact 18 including each of top, bottom, and side portions 22, 24, and 26, respectively, can be electroplated and/or physically, mechanically, and/or chemically deposited metal. In other aspects, electrical contact 18 can comprise a metallic body or portion of material that can be bent and/or crimped about a portion of submount 12 to form top, bottom, and side portions 22, 24, and 26, respectively. In further aspects, side contact portion 26 can comprise an exposed electrically conductive via, a conductive paste, ink, epoxy, metal, or end cap. Top, bottom, and side contact portions 22, 24, and 26, respectively, can comprise areas of deposited metal applied via chemical or physical deposition over portions of adjacent external sides or surfaces of submount 12. In one aspect, metal can be deposited along at least two adjacent sides or surfaces, such that at least one of the adjacent top, bottom, and/or side contact portions 22, 24, and 26 can comprise and/or form at least one electrical trace. In some aspects, metal can be deposited on all three adjacent external sides/surfaces to form top, bottom, and side contact portions 22, 24, and 26, respectively. Notably, side contact portion 26 can comprise a path for conveying electrical signal between top contact portion 22 and bottom contact portion 24. Thus, side contact portion 26 can physically and electrically connect top contact portion 22 and bottom contact portion 24. This can advantageously allow for bottom contact portion 24, side contact portion 26, or combinations thereof to be mounted over and electrically communicate with an outside power source (not shown), such that the components 10 and 20 can be mounted in a plurality of different configurations and/or allow for a plurality of components 10 and 20 to be mounted in a plurality of different orientations or configurations within a lighting fixture or lighting device.

In one aspect, portions of bottom and side contact portions 24 and 26, respectively, can be configured to thermally communicate with an external substrate or heat sink which can be the same as and/or different than the outside power source. This can advantageously allow one or more portions of components 10 and 20 to electrical and/or thermally communicate with one or more external substrates or surfaces via one or more portions of external electrical contacts 18. In one aspect, portions of bottom and side contact portions 24 and 26, respectively, either alone or in combination, can be soldered to an external substrate, surface, heat sink, power source, or combinations thereof.

In one aspect, emitter components 10 and 20 can comprise two electrical contacts 18 configured to pass electrical signal or current from the outside power source (not shown) such as a circuit board, a printed circuit board (PCB), a metal core printed circuit board (MCPCB), or other electrical source into the one or more LED chips 14. Portions of electrical contacts 18 can be soldered, or otherwise connected to the outside power source. LED chips 14 can illuminate upon receiving electrical current passed between at least two electrical contacts 18. In one aspect, a first electrical contact 18 can comprise an anode and a second electrical contact 18 can comprise a cathode. The anode and cathode can be configured to electrically connect with LED chip 14 via wirebonds 28. A first end 30 of wirebond 28 can be configured to physically and electrically connect with an electrical contact (e.g., a bond pad) disposed on LED chip 14. An opposing end of wirebond 28 can physically and electrically connect with and/or directly or indirectly attach to electrical contact 18. Wirebond 28 can comprise any suitably electrically conductive material such as a metal, in one aspect, a wire comprising gold (Au) or a Au-alloy.

Notably, electrical contact 18 can comprise a wraparound contact (also referred to as a "lead") which can wrap about portions of submount 12. That is, each electrical contact 18 can be disposed along portions of at least three external sides, edges, or surfaces (denoted 1-3) of submount 12. In some aspects, two opposing electrical contacts 18 can be disposed along portions of at least four external sides, edges, or surfaces (denoted 1-4, where 2 and 4 are opposing side surfaces) of submount 12. In one aspect, side contact portion 26 can be disposed along a surface that is substantially orthogonal to surfaces having top and/or bottom contacts 22 and 24. Electrical contacts 18 can adapt to and conform to any cross-sectional shape of submount 12. For example and for illustration purposes only, electrical contacts 18 are illustrated as conforming to a substantially rectangular shaped cross-section. That is, contacts 18 can conform to the rectangular shape along at least three sides. However, contacts 18 contacting more than three sides and/or conforming to other shapes and/or conforming to differently angled surfaces are also contemplated herein. For example, contacts 18 could comprise more than one side contact portion 26 adapted to conform to a submount 12 that is a multi-faceted, multi-angled, and/or having a non-rectangular cross-sectional shape. Side contact portion 26 can electrically connect top and bottom contact portions 22 and 24 and can allow components 10 and 20 to comprise side and/or bottom SMD. In one aspect, side contact portion 26 can comprise a same material as top and bottom contact portions 22 and 24, respectively. In other aspects, side contact portion 26 can comprise a different material than top and bottom contact portions 22 and 24, respectively. In further aspects, each of top, bottom, and side contact portions 22, 24, and 26 can comprise different materials.

FIG. 2 illustrates component 20, further comprising one or more layers of material 32 disposed over at least a portion of electrical contact 18. In one aspect, electrical contacts 18 can be electroplated, coated, or layered with a wirebondable material for improving adhesion between wirebond 28 and electrical contact 18. More than one layer of material 32 is also contemplated herein. For example, layer 32 can comprise an adhesion promoting layer, such as electroless nickel and immersion gold materials (i.e., ENIG) for improving the bonding or adhesion between wirebonds 28 and electrical contact 18. For illustration purposes, layer 32 is shown extending at least partially over top contact portion 22; however, layer 32 can also optionally extend over portions of side and/or bottom contact portions 26 and 24, respectively. In addition, and as noted above with respect to FIG. 2, component 20 can further comprise one or more intervening layers of material 16 disposed between LED chip 14 and submount 12 for improving bonding and/or heat conduction therebetween. Layers 18 and 32 can comprise the same and/or different materials.

Still referring to FIGS. 1 and 2, and in one aspect, electrical contact 18 can comprise one or more layers of electroplated material. One or more external surfaces can be electroplated with one or more layers of material before, after, or during the die attachment of one or more LED chips 14. In one aspect, top, bottom, and side contact portions 22, 24, and 26, respectively, of electrical contact 18 can comprise a layer of electroless silver (Ag) and one or more layers of copper (Cu) that have been electroplated via any suitable and known processing technique. In other aspects, electrical contact 18 can comprise a layer of immersion silver and one or more layers of Cu electroplated via any suitable and known processing technique. In yet further aspects, top, bottom, and side contact portions 22, 24, and 26, respectively, of electrical contact 18 can comprise layers of electroplated nickel (Ni) and Ag with one or more layers of electroplated Cu. In further aspects, top, bottom, and side contact portions 22, 24, and 26, respectively, of electrical contact 18 can comprise one or more layers of electroplated Ni and Ag. Layers can be optionally be deposited as alternating layers of Ni, Au, and/or Cu. Electrical contact 18 can also be electroplated with one or more layers of electrolytic or immersion gold (Au) either alone or in combination with layers of electroplated Ag, Ni, and/or Cu. Electrical contact 18 can further comprise one or more layers of electroplated palladium (Pd) either alone or in combination with layers of electroplated Ag, Ni, Cu, and/or Au.

Top, bottom, and side contact portions 22, 24, and 26, respectively, can be plated with the same and/or different materials. For example, in one aspect, each of top, bottom, and side contact portions 22, 24, and 26, respectively, comprise the same layer(s) of material or electroplated metal(s). In further aspects, top and bottom contact portions 22 and 24, respectively, can be electroplated with a first material and/or one or more layers selected from Ag, Ni, Cu, Au, Pd, and/or combinations thereof, and side contact portion 26 can be electroplated with a second material and/or one or more layers selected from Ag, Ni, Cu, Au, Pd, and/or combinations thereof, where second material is different than first material. In further aspects, side contact portion 26 can comprise an area of conductive paste, ink, epoxy, metal, an exposed metallic via (e.g., FIGS. 5A and 6A), or an end cap.

Figure 3:
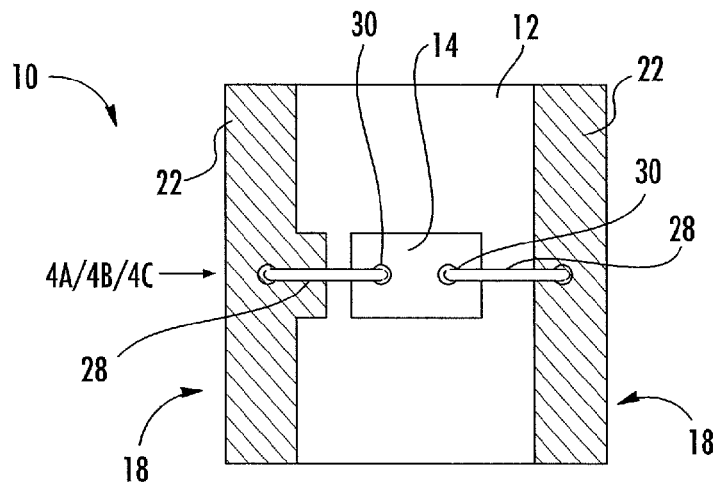
FIG. 3 is a top view of a light emitter component according to the disclosure herein.
Figure 4A:
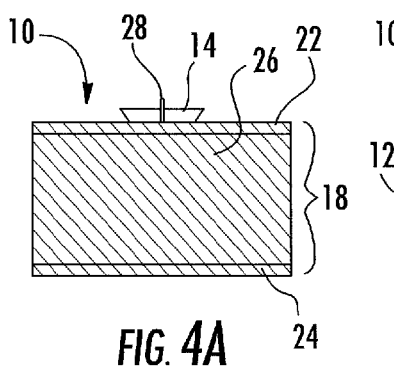
FIGS. 4A to 4C are side views of further embodiments of light emitter components according to the disclosure herein.
Figure 4B:
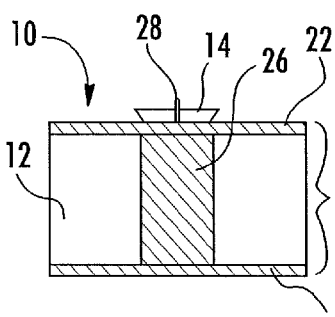
Figure 4C:
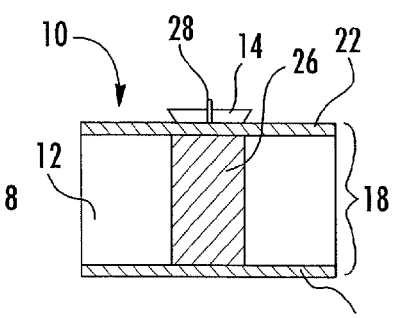

FIG. 3 illustrates a top view of component 10. FIGS. 4A to 4C illustrate various alternative side views of component 10. As FIG. 3 illustrates, LED chip 14 can be disposed over and mounted either directly or indirectly to a non-metallic submount 12. As noted above, component 10 can comprise a ceramic based light emitter component (e.g., comprising a ceramic based submount) for providing improved light scattering and reflection and, therefore, improved efficiency, brightness, and light extraction capabilities. Ceramic based submounts may also be desirable for use in light emitter components described herein for improved thermal management properties. For example, $Al_2O_3$ materials exhibit relatively low thermal resistance, low moisture sensitivity, superior reliability at high temperature environments, and the superior ability to dissipate heat.

LED chip 14 can electrically connect with two top contact portions 22 of two electrical contacts 18 via wirebonds 28. The two top contact portions 22 can comprise opposing electrical polarities (e.g., an anode and a cathode). LED chip 14 can comprise a horizontal chip having two electrical contacts of opposing electrical polarities (e.g., anode and cathode in the form of bond pads) on an upper surface of the LED chip 14, such that the upper surface of chip can be wirebonded to top contact portions 22 for passing electrical current from the top contact portions 22 into the LED chip 14 for illuminating the LED chip 14. As FIG. 3 illustrates, top contact portions 22 can comprise different shapes or surface designs for denoting electrical polarity (e.g., the anode or the cathode) of component 10.

Notably, as the side views 4A to 4C illustrate, component 10 can comprise a wraparound or fully external electrical contact 18 having a top contact portion 22 connected to a bottom contact portion 24 via a side contact portion 26. As FIGS. 4A and 4B illustrate, top contact, bottom contact, and side contact portions 22, 24, and 26, respectively, can comprise the same material, as denoted by the same shading. FIG. 4C shows an embodiment where top and bottom contact portions 22 and 24 can comprise a first material that is different than the material of side contact portion 26 as denoted by the different shading. FIG. 4A further illustrates, in one embodiment side contact portion 26 can extend substantially the full width and cover substantially the full external, lateral side surface of component 10. As FIGS. 4B and 4C illustrate, side contact 26 can also extend over a portion of the width, and can comprise a portion that covers less than the full width, or less than the full lateral side surface area of component 10. In one aspect, each of top, bottom, and side contact 22, 24, and 26, respectively, can comprise electroplated layers of metal(s) comprising one or more elements selected from the group of electroplated Ag, Ni, Cu, Au, and/or Pd.

Figure 5A:
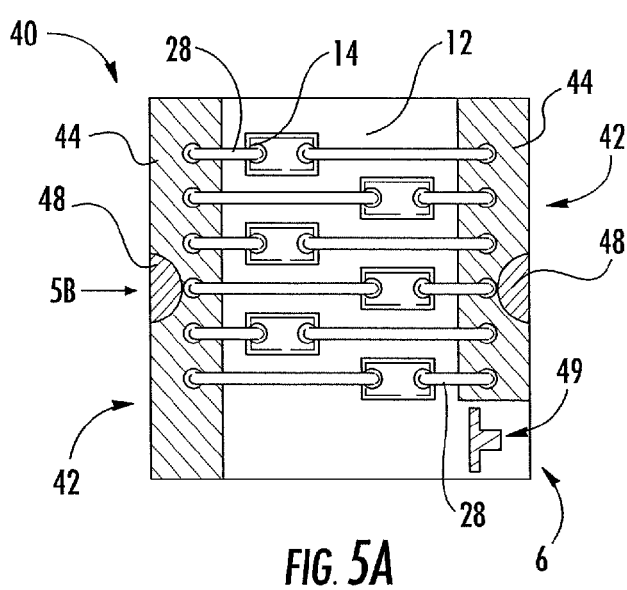
FIGS. 5A and 5B are top and side views, respectively, of a further embodiment of a light emitter component according to the disclosure herein.
Figure 5B:
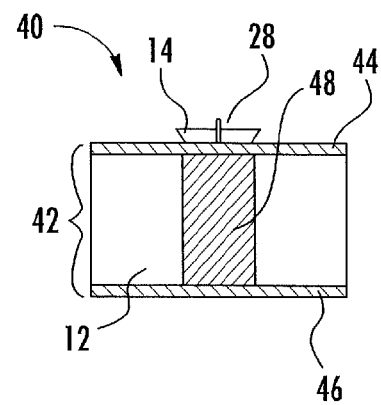

FIGS. 5A and 5B illustrate a further embodiment of a light emitter component, generally designated 40. Light emitter component 40 can be similar in form and function to component 10 but can have more than one LED chip 14 and/or a side contact portion optionally formed by exposing metal disposed in an internal thru-hole or electrically conductive via. Emitter component 40 can comprise a non-metallic and/or ceramic based submount 12 with more than one LED chip 14 mounted to submount 12. In one aspect, emitter component 40 can comprise more than two LED chips 14, such as three LED chips 14, four LED chips 14, five LED chips 14, six LED chips 14, or more than six LED chips 14. Each LED chip 14 can be electrically connected in parallel, series, or combinations thereof. For illustration purposes, each chip 14 is shown as electrically connected in parallel with the remaining chips, however, chips connected in series and/or arrangements of series and parallel chips are contemplated herein.

Component 40 can further comprise an electrical contact 42 having a top contact portion 44, a bottom contact portion 46 and a side contact portion 48 connecting the top and bottom contact portions 44 and 46, respectively. Notably, side contact portion 48 can comprise an exposed thru-hole or via, and can comprise an area of exposed metal, such as Ag. The metal can be exposed by sawing, dicing, etching, cutting, or otherwise separating and exposing the metal inside the via, such that the metal is on an outer surface of submount 12. In one aspect, a large panel of ceramic material is provided, and one or more vias are provided therein. The vias can be sawn or cut through such that they are exposed along an outer surface of submount 12 when individual submounts are singulated from the large panel.

In one aspect, exposing the electrically conductive via can position a portion of the via along one or more external lateral sides of the submount 12 for electrically connecting top contact portion 44 to bottom contact portion 46. For example, submount 12 can be singulated from a large ceramic panel comprised of a plurality of thru-holes filled with metal, also known as electrically conductive vias. During singulation of submount 12, the panel can be cut or sawn such that the vias are cut in half, thereby exposing the metal inside. Top and bottom contact portions 44 and 46, respectively, can be electroplated to top and bottom surfaces of submount 12 either before or after isolating the submount 12 from the panel. The exposed vias can comprise side contact portions 48 for electrically connecting top and bottom contact portions 44 and 46. Notably, side contact portions 48 can be disposed along an external surface of submount 12, such that submount 12 can electrically and/or thermally communicate with one or more external substrates or heat sinks via side contact portion 48 and/or bottom contact portion 46. Notably, electrical contact 42 can be disposed along portions of at least three external surfaces of submount 12, and can be electrically connected to the more than one LED chip 14. As FIG. 5A illustrates, a symbol or indicator generally designated 49 can be disposed in the top surface and/or comprise a portion of top contact portion 44 of submount 12. Indicator 49 can denote the electrical polarity of that portion of component, for example, indicating the anode or cathode to assure proper electrical connection of the LED chips 14.

Figure 6A:
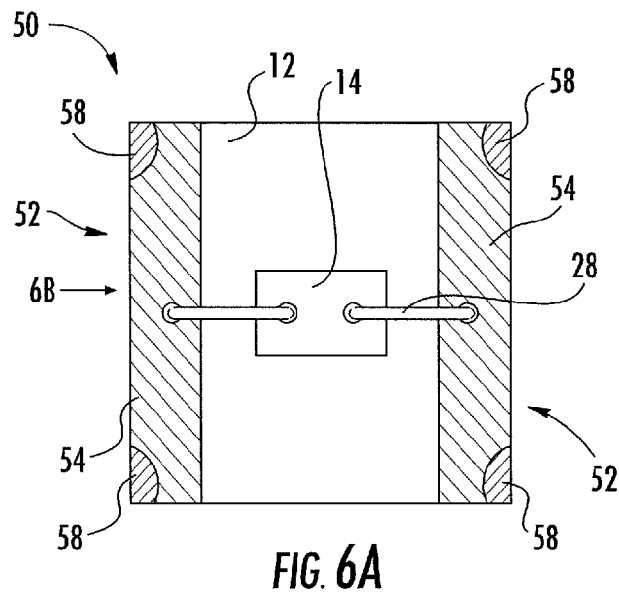
FIGS. 6A and 6B are top and side views, respectively, of a further embodiment of a light emitter component according to the disclosure herein.
Figure 6B:
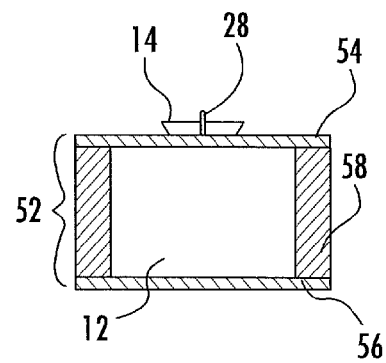

FIGS. 6A and 6B illustrate a further embodiment of a light emitter component, generally designated 50. Component 50 can be similar in form and function to component 40. For example, component 50 can comprise one or more side contact portions 58 formed by sawing or cutting through vias disposed in a large ceramic based panel during singulation of each individual submount 12. In this embodiment, component 50 can comprise at least two electrical contacts 52 disposed on opposing portions of submount 12. Each electrical contact 52 can comprise a top contact portion 54, a bottom contact portion 56, and one or more side contact portions 58. Top and bottom contact portions 54 and 56 can comprise areas of applied metal. In one aspect, top and bottom contact portions 54 and 56 can comprise areas of electroplated metal(s) selected from the group of electroplated Ag, Ni, Cu, Au, Pd, and/or combinations thereof.

Notably, electrical contacts 52 can comprise fully external contacts, which can, in essence, wraparound submount 12 such that contact is disposed along at least three external sides or surfaces of component 50. Side contact portions 58 can comprise areas of exposed metal. In one aspect, side contact portions 58 can comprise areas of Ag which have been exposed during singulation of submount 12. For example, a large, non-metallic panel can be provided. A plurality of metal filled vias can be provided in the panel. When singulating each submount 12, the panel can be cut or sawn such that each via is cut into and exposed, such that the exposed vias form one or more side contacts 58. In one aspect, four side contacts 58 can be formed by exposing four vias. At least two side contacts 58 can be disposed along a same lateral side, for example, along opposing outermost edges of the lateral side. In one aspect, side contact portions 58 can be disposed in corner areas of submount where two sides meet. More than one side contact 58 can advantageously provide more than one area where component 50 and an external power source or heat sink (not shown) can electrically and/or thermally connect. Thus, components provided herein can physically, electrically, and/or thermally connect to more than one external substrate, along more than one side, where desired. For example, the more than one side contact portion 58 can be soldered to more than one external substrate, either alone and/or in addition to bottom contact portions 56 being soldered to an external substrate.

Figure 7A:
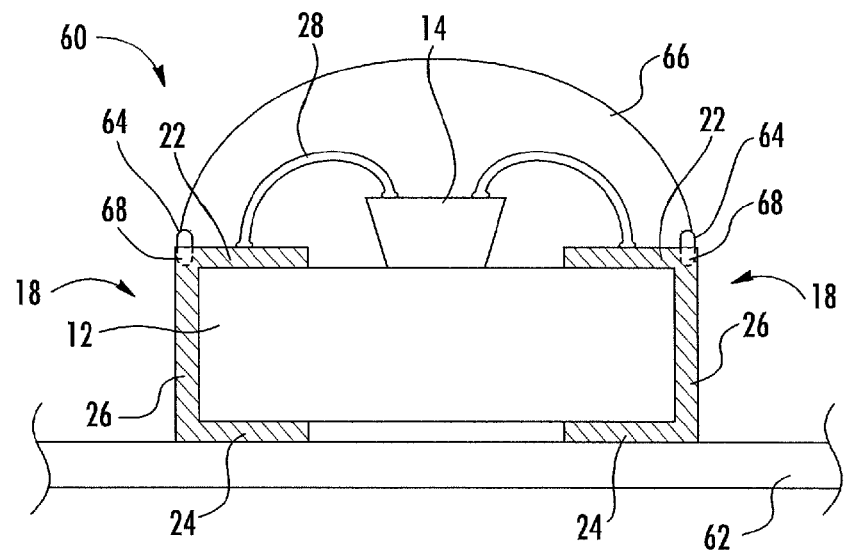
FIGS. 7A and 7B are cross-sectional views of further embodiments of light emitter component according to the disclosure herein.
Figure 7B:
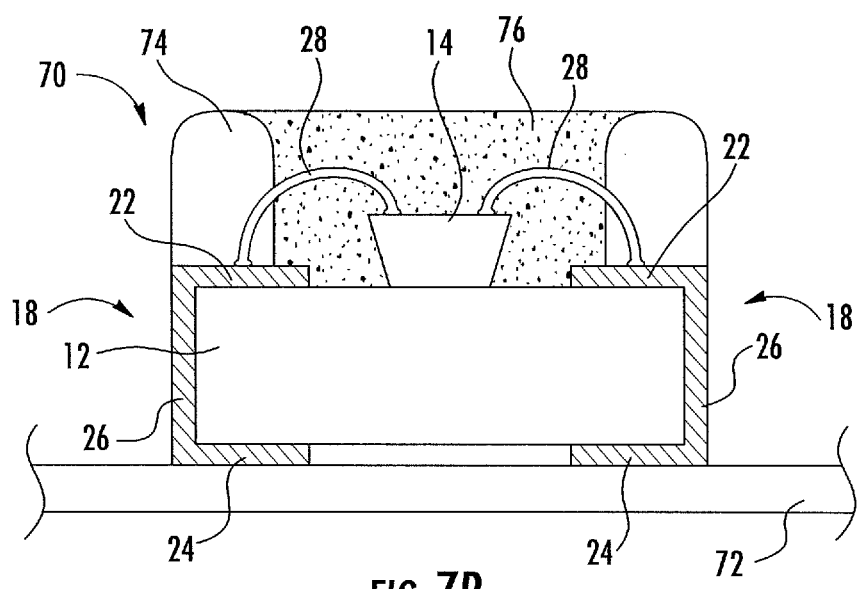

FIGS. 7A and 7B illustrate further embodiments of light emitter components, generally designated 60 and 70, respectively, where each component further comprises an optical element such as a lens or encapsulant material provided for obtaining a desired beam pattern or emission. Referring to FIG. 7A, light emitter component 60 can be disposed over an external substrate 62. In one aspect, external substrate 62 can comprise a PCB, a MCPCB, a circuit, a heat sink, or a portion of a light fixture. In one aspect, emitter component 60 can comprise electrical contacts 18, comprising top contact portions 22, bottom contact portions 24, and side contact portions 26. Top, bottom, and side contact portions 22, 24, and 26, respectively, can comprise areas of metal applied by chemically or physically depositing metal to a portion of the external sides or surfaces of submount 12. In one aspect, metal can be deposited along at least two adjacent sides or surfaces, such that at least one of the top, bottom, and side contact portions 22, 24, and 26 can comprise and/or form at least one electrical trace. In one aspect, top, bottom, and side contact portions 22, 24, and 26, respectively, can comprise areas of electroplated metal(s), for example, a metal chosen from the group consisting of Ag, Ni, Cu, Au, and/or Pd. In one aspect, top and bottom contact portions 22 and 24 can comprise areas of electroplated metal, and side contact portion 26 can comprise an area of exposed metal, such as a sawn or cut thru-hole or electrically conductive via (FIGS. 5A, 6A). Side contact portion 26 could also comprise an area of a conductive paste, ink, epoxy, metal, or end cap. At least one side contact portion 26 could also optionally be connected (e.g., physically, electrically, and/or thermally) to substrate 62 or to a different substrate, where desired.

Light emitter component 60 can further comprise a retention member 64. Retention member can comprise a cup or dam adapted to retain an optical element 66, such as a lens. In the alternative, light emitter component 60 can comprise one or more optional recesses 68 denoted in broken lines. Recesses 68 can comprise pre-cut grooves for retaining optical element and/or encapsulant within the top surface of submount 12 via surface tension. Optical element 66 can comprise a domed lens for producing a certain shape or beam pattern of light emission. The lens can be molded and cured using known processes. Optical element 66 can be formed directly and/or indirectly over a top surface of submount 12, and can be disposed over at least one LED chip 14. An array of lenses or optical elements 66 can be molded and/or positioned over a corresponding array of LED chips 14.

Optical element 66 can provide both environmental and/or mechanical protection of light emitter component 60. An optional layer of optical conversion material (not shown) can be applied directly over the one or more LED chips 14 and/or over one or more surfaces of optical element 66 (e.g., an inner or outer surface) for producing cool and/or warm white output. Optical conversion material can comprise one or more phosphors or lumiphors (e.g., yellow, red, and/or green phosphor) which can be activated by light emitted from the one or more LED chips 14. Optical element 66 can be disposed over a portion at least one of three external surfaces of the submount and/or over a portion of at least one of top, bottom, and side contact portions 22, 24, and 26, respectively. In further aspects, optical element 66 can be disposed over at least one of the side contact portion 26, the top surface of submount 12, or the bottom surface of submount 12.

LED chips 14 described herein can embody solid state emitters used alone and/or in combination with optical conversion material comprising, for example, phosphors or lumiphors to emit light of various colors, color points, or wavelength ranges, such as light that is primarily white, blue, cyan, green, yellow, amber, or red. In one aspect light emitter components described herein can comprise one or more LED chips 14 that can be primarily blue, which when illuminated, can activate a green or yellow phosphor disposed over the one or more chips 14 (e.g., phosphor can be at least partially directly disposed over LED chips 14 and/or on a portion of light emitter component 60 that is disposed over LED chips 14 such that the chips comprise blue shifted yellow (BSY) chips. In alternative embodiments, a primarily red LED chip 14 can be included in emitter components described herein and can be used alone and/or in combination with a BSY chip. In one aspect, a red LED chip 14 can also optionally be disposed below a phosphor, encapsulant, lens and/or combinations thereof, such as optical element 66 with a phosphor layer for mixing to produce warm white output. In yet a further embodiment, component 60 can comprise more than one LED chip 14 such as a plurality and/or array of LED chips 14. Each chip in the plurality or array of LED chips 14 can comprise approximately the same wavelength (e.g., selected from the same targeted wavelength bin). In another aspect, at least a first LED chip 14 of the plurality of chips can comprise a different wavelength than at least a second LED chip of the plurality of chips (e.g., at least a first LED chip 14 could be selected from a different targeted wavelength bin than at least one other LED chip 14).

FIG. 7B illustrates light emitter component 70 disposed over an external substrate 72, such as a circuit, PCB, MCPCB, or a heat sink. In one aspect, light emitter component 70 can be electrically and thermally connected to substrate 72 via solder (not shown). Emitter component 70 can comprise a retention material 74, such as a dam. In one aspect, retention material 74 can be comprise a dispensed material, such as a dispensed silicone, epoxy, or plastic material that can be optionally tinted white (e.g., via addition of $TiO_2$) for increasing the amount of light reflected and/or light emission from component 70. Component 70 can further comprise an optical element 76. Optical element 76 can comprise a layer of encapsulant filling material. An optional layer of optical conversion material (not shown) can be disposed over LED chips 14 and/or within optical element 76. In one aspect, optical element 76 can comprise a layer of silicone encapsulant or epoxy having a substantially flat surface. Concave or convex surfaces are also contemplated herein. Light emitter component 70 can comprise at least one LED chip 14 configured to activate a yellow, red, and/or green optical conversion material (e.g., yellow, red, and/or green phosphor, not shown) for producing cool and/or warm white output. In one aspect, optical element 76 can comprise a liquid curable silicone material, an epoxy material, or any encapsulant material such as a methyl or phenyl based encapsulant material.

Embodiments of the present disclosure shown in the drawings and described above are exemplary of numerous embodiments that can be made within the scope of the appended claims. It is contemplated that the novel light emitter components having improved wraparound electrical contacts and methods of making the same can comprise numerous configurations other than those specifically disclosed.

What is claimed is:

1. A light emitter component comprising:
    a submount;
    at least one light emitter chip on the submount;
    at least one electrical contact disposed along portions of at least three external surfaces of the submount, wherein the at least one electrical contact is spaced apart from the at least one light emitter chip and electrically connected to the at least one light emitter chip via a wirebond; and
    a reflective retention material disposed over the submount, wherein the reflective retention material covers portions of the wirebond for improving light extraction,
    wherein the at least one light emitter chip is mounted on the submount without an electrically conductive material being disposed between the at least one light emitter chip and the submount, and
    wherein a bottom surface of the at least one light emitter chip is located below an upper surface of the at least one electrical contact, the upper surface of the at least one electrical contact being a surface on which the wirebond is attached thereto.

2. The light emitter component of claim 1, wherein the at least one electrical contact comprises a top contact portion, a bottom contact portion, and a side contact portion.

3. The light emitter component of claim 2, wherein each of the top, bottom, and side contact portions comprise areas of electroplated metal.

4. The light emitter component of claim 2, wherein the side contact portion comprises a sawn thru-hole.

5. The light emitter component of claim 2, wherein the side contact portion physically connects the top contact portion to the bottom contact portion.

6. The light emitter component of claim 2, wherein the side contact portion electrically connects the top contact portion to the bottom contact portion.

7. The light emitter component of claim 2, wherein the side contact portion substantially covers a full width of a lateral side of the submount.

8. The light emitter component of claim 2, wherein the side contact portion is disposed over a portion of a lateral side of the submount.

9. The light emitter component of claim 2, wherein the side contact portion comprises an area of conductive paste, ink, epoxy, metal, an exposed metallic via, or an end cap.

10. The light emitter component of claim 1, wherein the submount comprises a ceramic material.

11. The emitter component of claim 10, wherein the ceramic material comprises aluminum oxide.

12. The light emitter component of claim 1, wherein the at least one light emitter chip comprises either a growth substrate or a carrier substrate.

13. The light emitter component of claim 1, further comprising an optical element disposed over a portion of at least one of the three external surfaces of the submount.

14. A light emitter component comprising:
    a submount;
    at least one light emitter chip on the submount;
    an electrical contact comprising a top contact portion, a bottom contact portion, and a side contact portion disposed between the top contact portion and the bottom contact portion, wherein the top, bottom, and side contact portions are external from and in contact with the submount; and
    a reflective retention material disposed over the submount, wherein the reflective retention material is at least partially disposed over the top contact portion for improving light extraction,
    wherein the at least one light emitter chip is mounted on the submount without an electrically conductive material being disposed between the at least one light emitter chip and the submount, and
    wherein a bottom surface of the at least one light emitter chip is located below an upper surface of the at least one electrical contact.

15. The light emitter component of claim 14, wherein the side contact portion comprises an area of conductive paste, ink, epoxy, metal, an exposed metallic via, or an end cap.

16. The light emitter component of claim 14, wherein the top contact portion, the bottom contact portion, and the side contact portion comprise areas of electroplated metal.

17. The light emitter component of claim 16, wherein the areas of electroplated metal comprise at least one material selected from the group consisting of silver, copper, nickel, gold, palladium, and combinations thereof.

18. The light emitter component of claim 14, wherein the at least one light emitter chip is wirebonded to the top contact portion.

19. The light emitter component of claim 14, wherein the bottom contact portion is soldered to an external substrate or heat sink.

20. The light emitter component of claim 14, wherein the reflective retention material is disposed at least partially about the at least one light emitter chip.

21. The light emitter component of claim 20, wherein an encapsulant is disposed between one or more walls of the reflective retention material.

22. The light emitter component of claim 14, wherein an encapsulant is disposed over the at least one light emitter chip.

23. The light emitter component of claim 14, wherein the submount comprises a ceramic material.

24. The light emitter component of claim 23, wherein the submount comprises aluminum oxide.

25. The light emitter component of claim 14, wherein the at least one light emitter chip is mounted to the submount via an adhesive layer.

26. The light emitter component of claim 14, wherein each of the side contact portion, the top contact portion, and the bottom contact portion are comprised of a same electrically conductive material.

27. The light emitter component of claim 14, wherein the top and bottom contact portions comprise a first electrically conductive material and the side contact portion comprises a second electrically conductive material that is different from the first electrically conductive material.

28. The light emitter component of claim 14, comprising three light emitter chips.

29. The light emitter component of claim 14, comprising six light emitter chips.

30. The light emitter component of claim 14, further comprising an optical element disposed over at least one of the top contact portion, the bottom contact portion, or the side contact portion.

31. A light emitter component comprising:
    a submount;
    at least one light emitter chip disposed over the submount;

first and second electrically conductive side contact portions disposed on a same external face of the submount and extending substantially parallel to each other between a top surface and a bottom surface of the submount; and a top contact portion electrically communicating with the first and second electrically conductive side contact portions, wherein the at least one light emitter chip is wirebonded to the top contact portion and the top contact portion is external to the submount.

32. The light emitter component of claim 31, wherein the side contact portions are spaced apart from each other along external lateral sides of the submount.

33. The light emitter component of claim 31, wherein the side contact portions physically and electrically connect the top contact portions to respective bottom contact portions.

34. The light emitter component of claim 31, wherein the side contact portions comprise areas of conductive paste, ink, epoxy, metal, an exposed metallic via, or an end cap.

35. The light emitter component of claim 31, wherein the at least two top contact portions, a bottom contact portion, and the first and second side contact portions comprise areas of electroplated metal.

36. The light emitter component of claim 35, wherein the electroplated metal comprises at least one metal selected from the group consisting of silver, copper, nickel, gold, palladium, and combinations thereof.

37. The light emitter component of claim 31, wherein the submount comprises a ceramic material.

38. The light emitter component of claim 37, wherein the submount comprises aluminum oxide.

39. The light emitter component of claim 31, further comprising an optical element disposed over the submount.

40. A method of providing a light emitter component, the method comprising:
   providing a submount;
   providing at least one light emitter chip on the submount without any electrically conductive material being disposed between the at least one light emitter chip and the submount;
   applying metal to at least a portion of one or more external lateral sides of the submount for electrically connecting a top contact portion to a bottom contact portion;
   connecting the at least one light emitter chip to the top contact portion via a wirebond; and
   dispensing a reflective retention material over the submount, wherein all of the reflective retention material covers portions of the wirebond for improving light extraction,
   wherein a bottom surface of the at least one light emitter chip is located below an upper surface of the at least one electrical contact, the upper surface of the at least one electrical contact being a surface on which the wirebond is attached thereto.

41. The method according to claim 40, wherein applying metal comprises electroplating at least a portion of the one or more external lateral sides of the submount.

42. The method according to claim 40, wherein applying metal comprises chemically or physically depositing metal to at least a portion of the one or more external lateral sides of the submount.

43. The method according to claim 40, wherein providing the at least one light emitter chip over the submount comprises mounting the at least one light emitter chip directly to a top surface of the submount.

44. The method according to claim 40, wherein providing a submount comprises providing a ceramic submount.

45. The method according to claim 40, further comprising providing an optical element over a portion of least one of the top contact portion, the bottom contact portion, or the one or more external lateral sides.

46. A method of providing a light emitter component, the method comprising:
   providing a submount;
   providing at least one light emitter chip over the submount;
   exposing a plurality of electrically conductive vias such that portions of the vias are disposed along one external lateral side of the submount for electrically connecting a top contact portion to a bottom contact portion, wherein the top contact portion is external to the submount; and
   connecting the at least one light emitter chip to the top contact portion by at least one wirebond,
   wherein a bottom surface of the at least one light emitter chip is located below an upper surface of the at least one electrical contact, the upper surface of the at least one electrical contact being a surface on which the at least one wirebond is attached thereto.

47. The method according to claim 46, wherein providing the at least one light emitter chip over the submount comprises mounting the at least one chip directly to a top surface of the submount.

48. The method according to claim 46, wherein providing a submount comprises providing a ceramic submount.

49. The method according to claim 46, wherein exposing the plurality of electrically conductive vias comprises sawing through the electrically conductive vias.

50. The method according to claim 46, further comprising providing an optical element over a portion of least one of the top contact portion, the bottom contact portion, or the one or more external lateral sides.

51. A light emitter component comprising:
   a submount;
   a light emitting diode (LED) chip disposed on the submount without any electrically conductive material being disposed between the at least one light emitter chip and the submount; and
   an electrical contact;
   wherein the electrical contact wraps around and is in contact with at least three external surfaces of the submount;
   wherein a first portion of the electrical contact is disposed along a first of the at least three external surfaces, which is orthogonal to a second portion of the electrical contact disposed along a second of the at least three external surfaces;
   wherein a reflective retention material is disposed over the submount and at least partially disposed over the first portion of the electrical contact for improving light extraction;
   wherein the first portion of the electrical contacts is entirely external to the submount; and
   wherein a bottom surface of the at least one light emitter chip is located below an upper surface of the at least one electrical contact.

52. The light emitter component of claim 51, further comprising an optical element disposed over a portion of at least one of the at least three external surfaces of the submount.

53. The light emitter component of claim 51, further comprising an optical element disposed over a portion of at least one of six external surfaces of the submount.

* * * * *